United States Patent
Hsiao et al.

(10) Patent No.: US 8,837,219 B2
(45) Date of Patent: Sep. 16, 2014

(54) METHOD OF PROGRAMMING NONVOLATILE MEMORY

(75) Inventors: Kai-Yuan Hsiao, Taichung (TW);
Wen-Yuan Lee, Hsinchu County (TW);
Yun-Jen Ting, Hsinchu County (TW);
Cheng-Jye Liu, Hsinchu County (TW);
Wein-Town Sun, Taoyuan County (TW)

(73) Assignee: eMemory Technology Inc., Hsinchu Science Park, Hsin-Chu (TW)

( * ) Notice: Subject to any disclaimer, the term of this patent is extended or adjusted under 35 U.S.C. 154(b) by 153 days.

(21) Appl. No.: 13/468,043

(22) Filed: May 10, 2012

(65) Prior Publication Data

US 2013/0083598 A1    Apr. 4, 2013

Related U.S. Application Data

(60) Provisional application No. 61/541,085, filed on Sep. 30, 2011.

(51) Int. Cl.
G11C 16/04     (2006.01)
G11C 14/00     (2006.01)
H01L 27/115    (2006.01)
H01L 29/792    (2006.01)

(52) U.S. Cl.
CPC ............ *G11C 16/0466* (2013.01); *G11C 14/00* (2013.01); *H01L 27/11565* (2013.01); *H01L 29/792* (2013.01); *G11C 16/0416* (2013.01); *G11C 14/0063* (2013.01)
USPC ............ 365/185.14; 365/185.17; 365/185.26; 365/185.28

(58) Field of Classification Search
CPC ............... G11C 14/00; G11C 14/0063; G11C 16/0416; G11C 16/0466; H01L 27/11565; H01L 29/783
USPC .............. 365/185.14, 185.17, 185.26, 185.28
See application file for complete search history.

(56) References Cited

U.S. PATENT DOCUMENTS 6,747,899 B2 * 6/2004 Hsia et al. ................ 365/185.28
6,922,363 B2 * 7/2005 Hsu et al. ................ 365/185.29
(Continued)

FOREIGN PATENT DOCUMENTS

JP    H0773685  A    3/1995
JP    H098153   A    1/1997
JP    H09147585 A    6/1997
(Continued)

*Primary Examiner* — Pho M Luu
(74) *Attorney, Agent, or Firm* — Winston Hsu; Scott Margo

(57) ABSTRACT

Each memory cell of a plurality of memory cells of a memory has a well, source and drain regions, a storage layer, and a gate. The memory cells are in a matrix. Same column drain regions connect to the same bit line, same row gates connect to the same word line, and same column source regions connect to the same source line. The memory is programmed by applying a first voltage to a word line electrically connected to a memory cell of the plurality of memory cells, applying a second voltage different from the first voltage by at least a programming threshold to a bit line electrically connected to the memory cell, applying a third voltage different from the first voltage by at least the programming threshold to a source line electrically connected to the memory cell, and applying a substrate voltage to the plurality of memory cells.

15 Claims, 5 Drawing Sheets

(56) References Cited

U.S. PATENT DOCUMENTS

| | | | | |
|---|---|---|---|---|
| 7,817,472 | B2* | 10/2010 | Kuo et al. | 365/185.12 |
| 7,924,619 | B2* | 4/2011 | Aritome | 365/185.18 |
| 8,045,395 | B2* | 10/2011 | Yamada | 365/185.23 |
| 8,102,712 | B2* | 1/2012 | Goda et al. | 365/185.17 |

FOREIGN PATENT DOCUMENTS

| | | |
|---|---|---|
| JP | 2001319487 A | 11/2001 |
| JP | 2002118184 A | 4/2002 |
| JP | 2005175411 A | 6/2005 |
| JP | 2007142448 A | 6/2007 |

* cited by examiner

METHOD OF PROGRAMMING NONVOLATILE MEMORY

CROSS REFERENCE TO RELATED APPLICATIONS

This application claims the benefit of U.S. Provisional Application No. 61/541,085, filed Sep. 30, 2011 and entitled "Method of Programming Nonvolatile Memory," the contents of which are incorporated herein by reference in their entirety.

BACKGROUND OF THE INVENTION

1. Field of the Invention

The present invention relates to nonvolatile memory, and more particularly to a method of programming nonvolatile memory.

2. Description of the Prior Art

In current nonvolatile memory applications, critical dimension sensitivity is a barrier to improved performance. One programming method that exhibits lower sensitivity to critical dimension is Fowler-Nordheim (FN) programming, which has good uniformity, and thus lower critical dimension sensitivity. However, FN programming is also slow. Hot carrier programming, such as band-to-band hot electron (BBHE) programming is faster, but is more sensitive to critical dimension, which limits its application as a nonvolatile memory programming technique.

SUMMARY OF THE INVENTION

According to an embodiment, a programming method is for use in memory. Each memory cell of a plurality of memory cells of the memory comprises a well having a first conductivity type, source and drain regions of a second conductivity type opposite the first conductivity type, a storage layer, and a gate. The plurality of memory cells are arranged in a matrix with drain regions in the same column electrically connected to the same bit line, gates in the same row electrically connected to the same word line, and source regions in the same column connected to the same source line. The method comprises applying a first voltage to a word line electrically connected to a memory cell of the plurality of memory cells, applying a second voltage different from the first voltage by at least a programming threshold to a bit line electrically connected to the memory cell, applying a third voltage different from the first voltage by at least the programming threshold to a source line electrically connected to the memory cell, and applying a substrate voltage to the plurality of memory cells.

According to an embodiment, a memory array comprises a bit line electrically connected to a column of memory cells of the memory array, a source line electrically connected to the column of memory cells of the memory array, and not electrically connected to other source lines of the memory array, a word line electrically connected to a row of memory cells of the memory array, and a memory cell. The memory cell comprises a gate terminal electrically connected to the word line for receiving a first voltage during a programming operation, a first terminal electrically connected to the bit line for receiving a second voltage different from the first voltage by at least a programming threshold during the programming operation, a second terminal electrically connected to the source line for receiving a third voltage different from the first voltage by at least the programming threshold during the programming operation, and a well terminal for receiving a substrate voltage during the programming operation.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
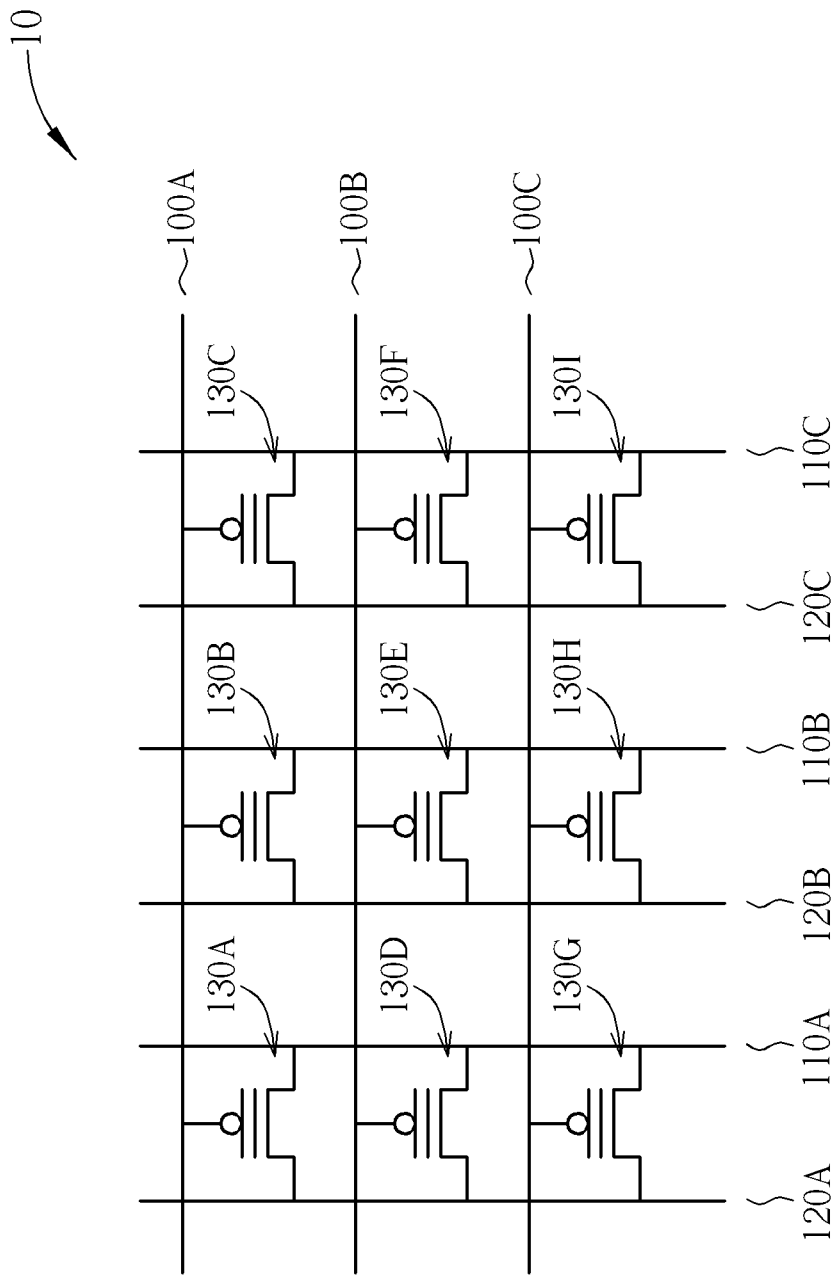
FIG. 1 is a diagram of a memory array according to an embodiment.

Please refer to FIG. 1, which is a diagram of a memory array 10 according to an embodiment. The memory array 10 comprises a plurality of word lines 100A-100C, a plurality of bit lines 110A-110C, a plurality of source lines 120A-120C, and a plurality of memory cells 130A-130I. Only nine memory cells are shown in FIG. 1 for simplicity of description. In practice, the memory array 10 may comprise many more memory cells than the nine shown in FIG. 1.

Taking memory cell 130E as an example, memory cell 130E may be a metal-oxide-semiconductor (MOS) transistor, such as a P-type MOS (PMOS), or an N-type MOS (NMOS) transistor, and may include a stack dielectric storage layer. Memory cell 130E has a gate terminal electrically connected to word line 100B, a drain terminal electrically connected to bit line 110B, and a source terminal electrically connected to source line 120B. Source lines 120A-120C are not electrically connected to each other.

Figure 2:
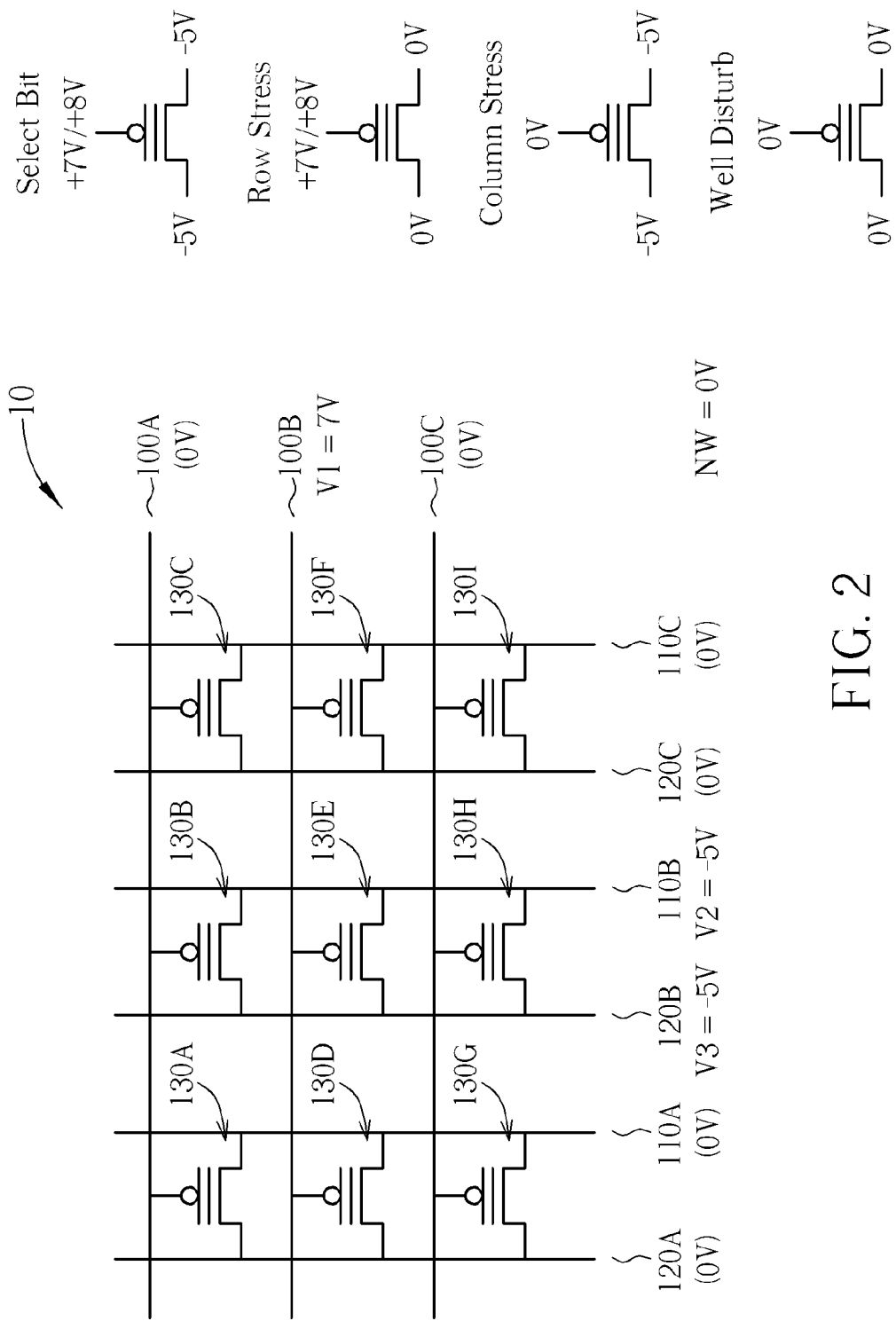
FIG. 2 is a diagram illustrating programming of memory cell 130E of memory array.
Figure 3:
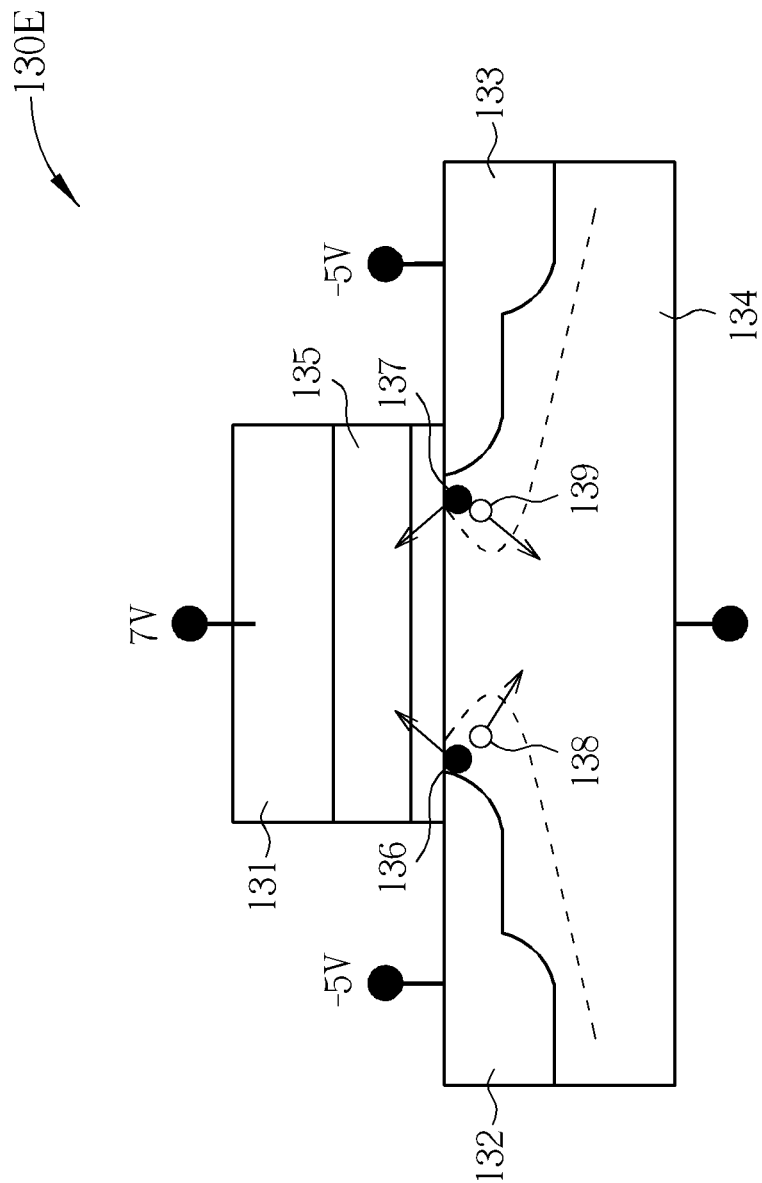
FIG. 3 is a diagram showing voltages of a read operation on memory cell of memory array.

Please refer to FIG. 2 and FIG. 3. FIG. 2 is a diagram illustrating programming of memory cell 130E of memory array 10. FIG. 3 is a diagram of memory cell 130E during programming. Memory cell 130E comprises a polysilicon gate 131, a source region 132, a drain region 133, a substrate region 134, and a charge trapping layer 135. To program memory cell 130E, in the case of the memory cell 130E being a PMOS transistor, a high voltage V1 is applied to the gate 131 of the memory cell 130E through the word line 100B, a first low voltage V2 is applied to the drain 133 of the memory cell 130E through the bit line 110B, and a second low voltage V3 is applied to the source 132 of the memory cell 130E through the source line 120B. For example, the high voltage V1 may be 7 Volts, the first low voltage V2 may be −5 Volts, and the second low voltage V3 may be −5 Volts. In this example, the first low voltage V2 and the second low voltage V3 are the same. The first low voltage V2 and the second low voltage V3 may also be different. For example, a programming threshold may be set that indicates voltage difference sufficient for programming the memory cell 130E, e.g. through BBHE programming. The programming threshold may be 7 Volts. Then, the first low voltage V2 may be set to −5 Volts, and the second low voltage V3 may be set to −3 Volts. Thus, the first low voltage V2 need only be sufficiently different from the high voltage V1 to exceed the programming threshold, and the second low voltage V3 need only be sufficiently different from the high voltage V1 to exceed the programming threshold. Using the above scheme, hot electrons 136, 137 tunnel to the charge trapping layer 135, and holes 138, 139 are drawn down to the substrate 134. During programming of the memory cell 130E, all other word lines, bit lines, and source lines may be set to 0 Volts.

As shown in FIG. 2, during programming, cells of the array 10 other than the cell under programming (cell 130E in FIG. 2) are in different states. Cells 130D and 130F experience row stress, with the high voltage V1 applied to the gate terminal, and 0V applied to the source and drain terminals. Cells 130B and 130H experience column stress, with 0V applied to the gate terminal, and the first and second low voltages V2, V3 applied to the drain and source terminals, respectively. Cells 130A, 130C, 130G, and 130I experience well disturb, with all terminals (gate, drain, source) set to 0V.

Figure 4:
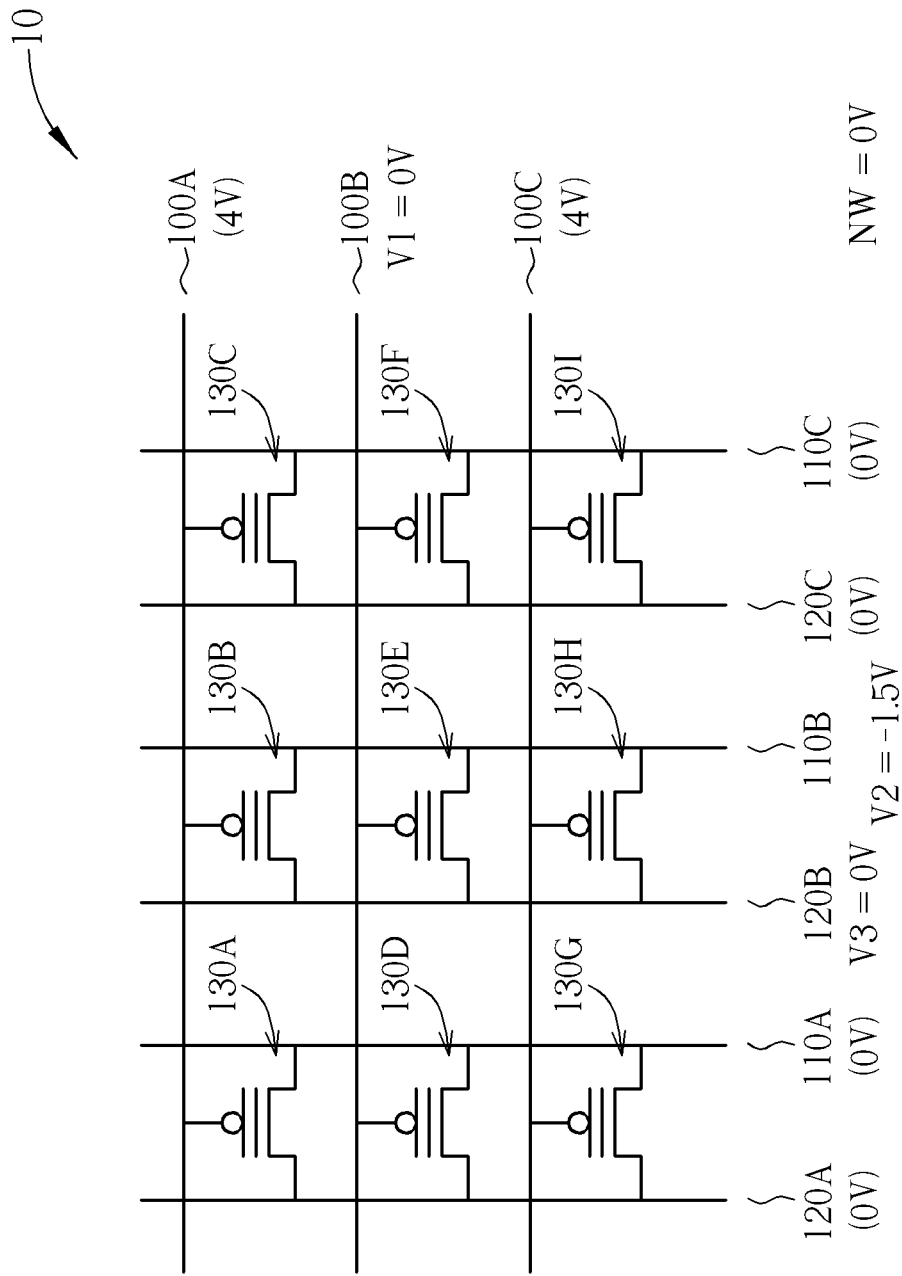
FIG. 4 is a diagram showing layout of the memory array of FIG. 1.

Please refer to FIG. 4, which is a diagram showing voltages of a read operation on memory cell 130E of memory array 10. During reading, voltage V1 is set to 0 Volts, voltage V2 is set to −1.5 Volts, and voltage V3 is set to 0 Volts. All other source and bit line voltages are set to 0 Volts, and all other word line voltages are set to 4 Volts. Read current is read from the memory cell 130E to determine programmed state (1 or 0) of the memory cell 130E.

Figure 5:
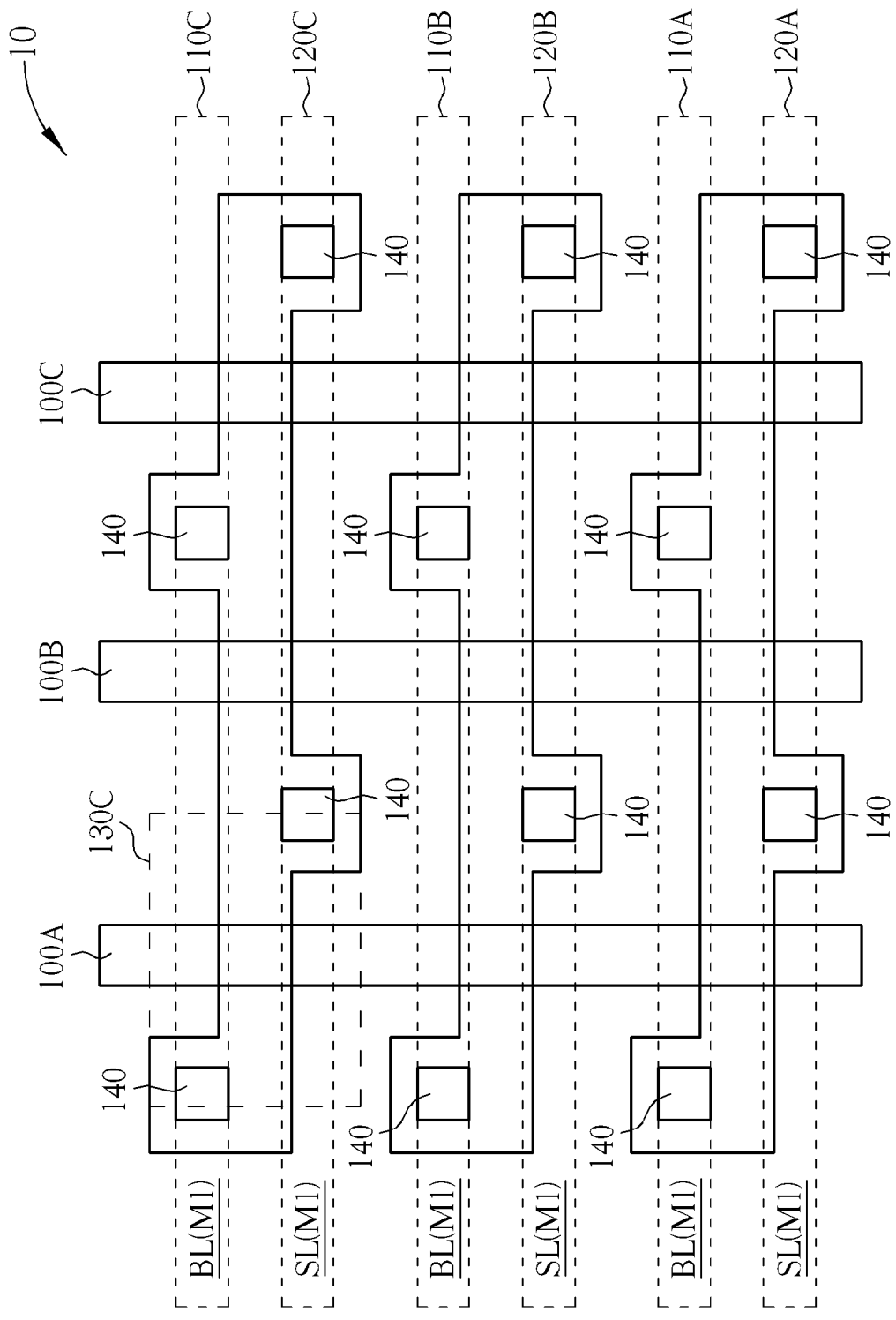
FIG. 5 is a diagram showing layout of the memory array 10 of FIG. 1.

Please refer to FIG. 5, which is a diagram showing layout of the memory array 10 of FIG. 1. The word lines 100A-100C may be formed of polysilicon, and the bit lines 110A-110C and source lines 120A-120C may be formed in a metal layer, such as Metal 1 (M1) of a typical process. Contacts 140 electrically connect the bit lines 110A-110C to the respective drain regions of the corresponding memory cells 130A-130I, and electrically connect the source lines 120A-120C to the respective source regions of the corresponding memory cells 130A-130I. Source lines 120A-120C are not mutually electrically connected. The memory array 10 may be built in a well having a first conductivity type, e.g. N-type. The source and drain regions of each memory cell 130A-130I may be of a second conductivity type opposite the first conductivity type, e.g. P-type.

Using the above architecture and programming method, the memory array 10 has twin-side BBHE speed which is insensitive to polysilicon critical dimension (CD) variation. Program disturbance is also very slight. BBHE programming also achieves good program erase window in the memory array 10.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A programming method for use in memory, each memory cell of a plurality of memory cells of the memory comprising a well having a first conductivity type, source and drain regions of a second conductivity type opposite the first conductivity type, a storage layer, and a gate, the plurality of memory cells being arranged in a matrix with drain regions in the same column electrically connected to the same bit line, gates in the same row electrically connected to the same word line, and source regions in the same column connected to the same source line, the method comprising:
    applying a first voltage to a word line electrically connected to a memory cell of the plurality of memory cells;
    applying a second voltage different from the first voltage by at least a programming threshold to a bit line electrically connected to the memory cell;
    applying a third voltage different from the first voltage by at least the programming threshold to a source line electrically connected to the memory cell; and
    applying a substrate voltage to the plurality of memory cells.

2. The method of claim 1, wherein the second voltage is roughly the same as the third voltage.

3. The method of claim 1, wherein the second voltage is different from the third voltage.

4. The method of claim 1, wherein the first conductivity type is N-type, the second conductivity type is P-type, the second voltage is lower than the first voltage, and the third voltage is lower than the first voltage.

5. The method of claim 1, wherein the programming threshold is sufficiently large to induce band-to-band hot electron programming of the memory cell.

6. The method of claim 1, wherein source lines of the memory are not electrically connected together.

7. The method of claim 1, wherein the storage layer is a stack dielectric storage layer.

8. A memory array comprising:
    a same bit line electrically connected to each memory cell of a column of memory cells of the memory array;
    a same source line electrically connected to each memory cell of the column of memory cells of the memory array, and not electrically connected to other source lines of the memory array; and
    a same word line electrically connected to each memory cell of a row of memory cells of the memory array;
    wherein each of the memory cells comprises:
        a gate terminal electrically connected to the word line for receiving a first voltage during a programming operation;
        a first terminal electrically connected to the bit line for receiving a second voltage different from the first voltage by at least a programming threshold during the programming operation;
        a second terminal electrically connected to the source line for receiving a third voltage different from the first voltage by at least the programming threshold during the programming operation; and
        a well terminal for receiving a substrate voltage during the programming operation.

9. The memory array of claim 8, wherein the second voltage is roughly the same as the third voltage.

10. The memory array of claim 8, wherein the second voltage is different from the third voltage.

11. The memory array of claim 8, wherein the well terminal is electrically connected to a well region of the memory cell having a first conductivity type, the first terminal is electrically connected to a source region of a second conductivity type opposite the first conductivity type, and the second terminal is electrically connected to a drain region of the second conductivity type.

12. The memory array of claim 11, wherein the first conductivity type is N-type, the second conductivity type is P-type, the second voltage is lower than the first voltage, and the third voltage is lower than the first voltage.

13. The memory array of claim 8, wherein the programming threshold is sufficiently large to induce band-to-band hot electron programming of the memory cell.

14. The memory array of claim 8, wherein the memory cell further comprises a storage layer.

15. The memory array of claim 14, wherein the storage layer is a stack dielectric storage layer.

* * * * *